US008492226B2

(12) United States Patent
Mathew et al.

(10) Patent No.: US 8,492,226 B2
(45) Date of Patent: Jul. 23, 2013

(54) TRENCH TRANSISTOR

(75) Inventors: Shajan Mathew, Singapore (SG); Purakh Raj Verma, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 0 days.

(21) Appl. No.: 13/237,969

(22) Filed: Sep. 21, 2011

(65) Prior Publication Data

US 2013/0069144 A1  Mar. 21, 2013

(51) Int. Cl.
*H01L 21/336* (2006.01)

(52) U.S. Cl.
USPC ........... 438/270; 438/272; 438/589; 257/330; 257/E21.419; 257/E21.418

(58) Field of Classification Search
USPC .......... 438/212, 268, 270, 272, 589; 257/330, 257/E21.41, E21.418, E21.419
See application file for complete search history.

(56) References Cited

U.S. PATENT DOCUMENTS

| 4,893,160 | A | * | 1/1990 | Blanchard | 257/334 |
|---|---|---|---|---|---|
| 4,914,058 | A | * | 4/1990 | Blanchard | 438/270 |
| 4,941,026 | A | * | 7/1990 | Temple | 257/333 |
| 4,954,854 | A | * | 9/1990 | Dhong et al. | 257/332 |
| 5,082,795 | A | * | 1/1992 | Temple | 438/138 |
| 5,326,711 | A | * | 7/1994 | Malhi | 438/138 |
| 5,637,898 | A | * | 6/1997 | Baliga | 257/330 |
| 5,998,833 | A | * | 12/1999 | Baliga | 257/329 |
| 6,262,453 | B1 | * | 7/2001 | Hshieh | 257/341 |
| 6,359,308 | B1 | * | 3/2002 | Hijzen et al. | 257/341 |
| 6,621,121 | B2 | * | 9/2003 | Baliga | 257/330 |
| 6,674,124 | B2 | * | 1/2004 | Hshieh et al. | 257/330 |
| 6,787,847 | B2 | * | 9/2004 | Disney | 257/328 |
| 6,787,848 | B2 | * | 9/2004 | Ono et al. | 257/328 |
| 7,319,256 | B1 | * | 1/2008 | Kraft et al. | 257/330 |
| 7,504,690 | B2 | * | 3/2009 | Kelly et al. | 257/328 |
| 7,576,388 | B1 | * | 8/2009 | Wilson et al. | 257/330 |
| 7,615,847 | B2 | * | 11/2009 | Zundel et al. | 257/607 |
| 7,625,793 | B2 | * | 12/2009 | Calafut | 438/212 |
| 7,633,120 | B2 | * | 12/2009 | Hebert | 257/330 |
| 7,807,576 | B2 | * | 10/2010 | Pan | 438/700 |
| 7,910,437 | B1 | * | 3/2011 | Baek et al. | 438/268 |
| 7,968,940 | B2 | * | 6/2011 | Udrea | 257/332 |
| 2002/0036319 | A1 | * | 3/2002 | Baliga | 257/328 |
| 2008/0035987 | A1 | * | 2/2008 | Hebert | 257/330 |

FOREIGN PATENT DOCUMENTS

DE  102008039881 A1  4/2009

* cited by examiner

*Primary Examiner* — Mary Wilczewski
(74) *Attorney, Agent, or Firm* — Horizon IP Pte Ltd

(57) ABSTRACT

A method of forming a device is disclosed. A substrate defined with a device region is provided. A buried doped region is formed in the substrate in the device region. A gate is formed in a trench in the substrate in the device region. A channel of the device is disposed on a sidewall of the trench. The buried doped region is disposed below the gate. A distance from the buried doped region to the channel is a drift length $L_D$ of the device. A surface doped region is formed adjacent to the gate.

18 Claims, 14 Drawing Sheets

TRENCH TRANSISTOR

BACKGROUND

Lateral Double-Diffused (LD) transistors have been widely employed in high voltage applications. The performance of the LD transistors depends on the drain-to-source on-resistance ($Rds_{on}$) as well as breakdown voltage. For example, low $Rds_{on}$ results in high switching speed while high breakdown voltage increases voltage capabilities.

Conventional techniques in achieving high breakdown voltage result in an increased distance between the drain and the gate. This, however, concomitantly increases $Rds_{on}$, undesirably decreasing the switching speed.

The disclosure is directed to transistors with fast switching speed and high breakdown voltage.

SUMMARY

A method of forming a device is disclosed. In one embodiment, the method includes providing a substrate defined with a device region. The method also includes forming a buried doped region in the substrate in the device region. The method further includes forming a gate in a trench in the substrate in the device region. A channel of the device is disposed on a sidewall of the trench. The buried doped region is disposed below the gate. A distance from the buried doped region to the channel is a drift length $L_D$ of the device. The method further includes forming a surface doped region adjacent to the gate.

In one embodiment, a method of forming a semiconductor device is disclosed. The method includes providing a substrate defined with a device region. The method also includes providing first and second device doped wells in the device region. The first device doped well includes first polarity type dopants and the second device doped well includes second polarity type dopants. The first device doped well has a depth greater than the second device doped well. The method also includes forming a buried doped region in the second device doped well. The method further includes forming a gate in a trench in the substrate in the device region. A channel of the device is disposed on a sidewall of the trench. The buried doped region is disposed below the gate. The distance from the buried doped region to the channel is a drift length $L_D$ of the device. The method further includes forming a surface doped region adjacent to the gate.

In yet another embodiment, a semiconductor device is disclosed. The semiconductor device includes a substrate defined with a device region. The semiconductor device also includes a buried doped region in the substrate in the device region. The semiconductor device further includes a gate in a trench in the device region. A channel of the device is disposed on a sidewall of the trench. The buried doped region is disposed below the gate. A distance from the buried doped region to the channel is a drift length $L_D$ of the semiconductor device. The semiconductor device further includes a surface doped region adjacent to the gate.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIGS. 2a-l show cross-sectional views of a process of forming an embodiment of a device.

DETAILED DESCRIPTION

Embodiments generally relate to semiconductor devices. Some embodiments relate to devices, such as low power-loss buck and boost regulators, power amplifiers and power management circuits. Such devices, for example, can be incorporated into standalone devices or ICs, such as microcontrollers or system on chips (SoCs). The devices or ICs can be incorporated into or used with, for example, electronic products, such as speakers, computers, cell phones, and personal digital assistants (PDAs).

Figure 1A:
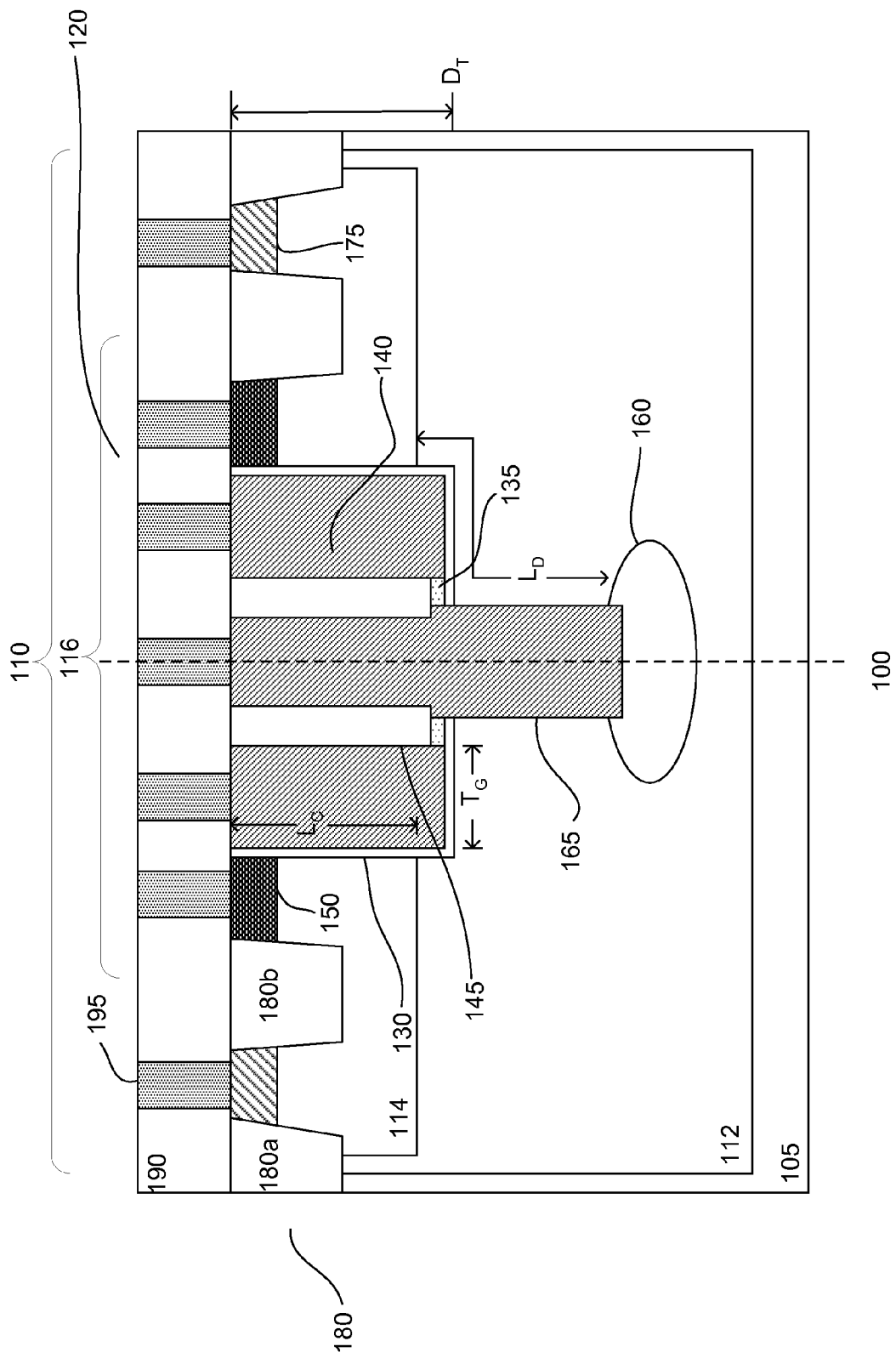
FIG. 1a shows cross-sectional view of an embodiment of a device.

FIG. 1a shows a cross-sectional view of an embodiment of a device 100. The cross-sectional view, as shown, illustrates the device along a channel length $L_C$. The device, as shown, is formed in a device region 110 defined on a substrate 105. The substrate, for example, is a semiconductor substrate, such as a silicon substrate. In one embodiment, the substrate may be a p-type doped substrate. For example, the p-type doped substrate is a lightly p-type doped substrate. Other types of semiconductor substrates may also be useful. For example, the substrate may be a silicon germanium, germanium, gallium arsenide, or crystal-on-insulator (COI) such as silicon-on-insulator (SOI). The substrate can be a doped substrate. The substrate may be doped with p-type or n-type dopants. The doped substrate may be a lightly doped substrate. Providing a substrate with other types of dopants or concentrations, including an undoped substrate, may also be useful.

The device may include dope regions or wells having different dopant concentrations. For example, the device may include heavily doped, intermediate doped and lightly doped regions. The doped regions may be designated by $x^-$, $x$ and $x^+$, where x indicates the polarity of the doping, such as p-type or n-type, and:

$x^-$=lightly doped;

x=intermediate doped; and $x^+$=heavily doped.

A lightly doped region has a dopant concentration of less than about $5E13/cm^3$, an intermediate doped region has a dopant concentration of about $5E13$-$5E15/cm^3$, and a heavily doped region has a dopant concentration of more than about $5E15/cm^3$. P-type dopants may include boron (B), aluminum (Al), indium (In) or a combination thereof, while n-type dopants may include phosphorus (P), arsenic (As), antimony (Sb) or a combination thereof.

Isolation regions 180 may be provided for isolating or separating different regions of the substrate. In one embodiment, the device region is isolated from other regions or device regions by a device isolation region 180a. For example, the device isolation region surrounds the device region. The isolation region, for example, is a shallow trench isolation (STI) region. Other types of isolation regions may also be employed. For example, the isolation region may be a deep trench isolation (DTI) region. The isolation regions, for example, extend to a depth of about 4000 Å. Providing isolation regions which extend to other depths, such as 0.5-10 µm for DTI regions, may also be useful. In one embodiment, the width of the isolation region is about 0.3 µm. Providing isolation regions having different depths and widths may also be useful.

In one embodiment, first and second device doped wells 112 and 114 are disposed in the substrate which encompass the device region. The second device doped well, in one embodiment, is disposed within the first device doped well. For example, the first device doped well has a depth greater than the second device doped well. In other embodiment, the first device doped well is disposed substantially within the device region. The first device doped well, for example, extends to a depth of about 3-5 µm. The depth, for example, is determined by device breakdown voltage and isolation requirements. For example, the depth of the second device doped well and the relative depth of the first device doped well with respect to the second device doped well should achieve the desired breakdown voltage and isolation requirements. Providing the first device doped well of different depth may also be useful. In one embodiment, the first device doped well has first polarity type dopants while the second device doped well has second polarity type dopants.

The second device doped well, in one embodiment, serves as the body well of a first polarity type device. The second device doped well may be doped with second polarity type dopants. For example, the dopant concentration of the second device doped well may be about $5E12$-$1E13/cm^3$. The first device doped well, for example, serves as a drift well for the first polarity type dopants. The drift well isolates the body from the substrate and lightly doped drain extension to provide high breakdown voltage. The first device doped well may be lightly doped with first polarity type dopants. For example, the dopant concentration of the first device doped well may be about $1$-$5E12/cm^3$. In the case of a n-type device, the first device doped well may be $n^-$ and the second device doped well may be $p^-$.

An internal device isolation region 180b may be provided to separate the device region into sub-regions. The internal device isolation region may be used to provide separate sub-regions for different types of doped regions, such as surface diffusion regions. For example, the internal device isolation region provides a body region between it and the device isolation region for a body contact region 175 to bias the second device doped well. The body contact region, for example, is heavily doped with second polarity type dopants.

The internal device isolation region, for example, may be provided on one side of the device region. As shown, the internal device isolation region may be disposed in the device region along the direction of the width of the gate. Providing the internal device isolation region in a direction which is perpendicular to the width of the gate may also be useful. In some embodiment, two internal device isolation regions may be provided to provide two body contact regions. Alternatively, the internal device isolation region may be surrounded by the device region. Other arrangements or configuration of the internal device isolation regions may also be useful. For example, more than two device isolation regions may be provided. In other embodiments, no internal device region is provided. For example, abutting body contact and source regions may be employed. In some applications, no body contact region is needed for an unbiased body well.

A transistor region 116 is provided in the device region for a transistor 120. The transistor region, for example, is defined by the internal device isolation region. For example, in the case where the internal device isolation region is surrounded by the device isolation region, the transistor region is within the internal device isolation region. In the case where two internal device isolation regions are provided, the transistor region is disposed therebetween. In other embodiments, such as in the case of one internal device isolation region along one direction of the device region, the transistor region is between the internal isolation region and device isolation region. Other configurations of the transistor region may also be useful.

The transistor includes first and second source/drain (S/D) regions 150 and 160 separated by a gate. The S/D regions are heavily doped regions in the substrate. In one embodiment, the S/D regions are heavily doped regions with first polarity type dopants. For example, the S/D regions may be $n^+$ doped regions for a n-type device. In one embodiment, the first S/D region is a source and the second S/D region is a drain. Other configurations of S/D regions may also be useful.

The gate, in one embodiment, includes a gate electrode 140 and a gate dielectric 130. The gate dielectric separates the gate electrode from the substrate. The gate electrode, for example, may be polysilicon. Other types of gate electrode materials, such as composite materials, may also be useful. In some embodiments, the gate electrode may include multiple gate electrode layers, forming a composite gate electrode. For example, the composite gate electrode may be amorphous silicon, polysilicon and tungsten. The gate electrode may have a thickness ($T_G$) of about 1500-4000 Å. In one embodiment, the gate electrode may have a thickness ($T_G$) of about 2000 Å. Other gate electrode thicknesses may also be useful.

As for the gate dielectric, it may be silicon oxide. Other types of gate dielectric materials may also be useful. For example, oxynitride. In one embodiment, the gate dielectric is a high voltage gate dielectric. The gate dielectric may be about 100-1000 Å thick. Other gate dielectric thicknesses may also be useful. The gate dielectric thickness, for example, may depend on the maximum voltage at the gate ($V_{GS}$).

The transistor, in one embodiment, is a trench transistor. The trench transistor includes a gate disposed in a trench in a substrate. The gate dielectric lines the trench sidewalls and a portion of the bottom of the trench, separating the gate electrode from the substrate. The trench has a depth $D_T$. The depth $D_T$, in one embodiment, is deeper than the interface of the first and second device doped wells. For example, the trench extends pass the second device doped well into the first device doped well. The depth $D_T$ should be sufficient for the gate electrode to extend into the first device doped well. The depth $D_T$, for example, may be about 0.3 µm deeper than the interface of the device doped wells. Providing $D_T$ having other depths relative to the interface of the device doped wells may also be useful.

The trench sidewall adjacent to the gate forms a channel of transistor. In one embodiment, the trench sidewall adjacent to the gate from the surface of the substrate to the interface of the device doped wells forms the channel of the transistor. The channel length $L_C$ is the distance from the surface of the substrate to the interface of the device doped wells. The channel length $L_C$, for example, may be about 0.3-3 µm. Other channel lengths may also be useful. The channel length, for example, is determined by the reversed bias voltage across the drain and source ($BV_{DSS}$) and the drain-to-source on-resistance ($Rds_{on}$).

A first S/D region is located on the surface of the substrate adjacent to the gate. The first S/D region has a depth of about 2000 Å. Other depths may also be useful. In one embodiment, the first S/D region is disposed between the internal device isolation region and the gate. Disposing the first S/D region at other locations may also be useful.

A second S/D region is disposed in the substrate below the gate, forming a buried S/D region. The second S/D region is vertically displaced or offset from the channel of the transistor. For example, the second S/D region is disposed at a depth greater than the interface of the first and second device doped wells and within the first device doped well. In one embodiment, the second S/D region is disposed at a depth greater than $D_T$. The distance between the second S/D region and channel (e.g., the interface of the device doped wells) defines the drift length $L_D$ of the transistor. The drift length $L_D$ should be sufficient to block the off-state voltage at the drain terminal. The drift length $L_D$, for example, may be about 0.5-1.5 μm. Other lengths for $L_D$ may also be useful.

In one embodiment, the second S/D region is vertically and laterally displaced from the gate. In one embodiment, the second S/D region is vertically and laterally displaced from the channel of the transistor. For example, the second S/D region includes vertical and lateral displacement components from the channel. As such, $L_D$ includes vertical and lateral displacement components of the second S/D region.

The lateral displacement facilitates providing a drain connector 165 for accessing the second S/D region from the surface of the substrate. The drain connector, for example, is disposed adjacent to the gate and extends from the surface of the substrate to the second S/D region. The drain connector includes a conductive material. In one embodiment, the drain connector includes polysilicon. The drain connector, for example, is heavily doped with first polarity type dopants. Other types of conductive materials may also be used to form the drain connector.

The drain connector and gate are isolated from each other by a gate insulator. In one embodiment, gate insulator includes a primary gate insulator 145 and a secondary gate insulator 135. The primary gate insulator may be silicon oxide while the secondary gate insulator may be silicon nitride. The gate insulator may also be formed with other dielectric materials. Other configurations of the gate insulator may also be useful. For example, the gate insulator may be a single gate insulator or other number of gate insulators.

A dielectric layer 190 may be disposed over the substrate. It is understood that there may be additional layers between the dielectric layer and substrate, such as, for example, an etch stop layer. The dielectric layer serves as an interlevel dielectric (ILD) layer. The dielectric layer may be, for example, silicon oxide. Other types of dielectric materials, such as doped $SiO_2$, Boron-Doped Phosphosilicate Glass (BPSG) or Borophosphosilicate Tetraethylorthosilicate Glass (BP-TEOS), may also be useful for the ILD layer.

The first S/D region, second S/D region, gate electrode and body contact region serve as source, drain, gate and body terminals of the device. Interconnects, which include contacts 195 and conductive lines (not shown), are provided in the ILD layer. The device may include multiple interconnect levels. The contacts, for example, provide connections to the terminals of the device. For example, contacts are provided to the source, drain, gate and body contact region.

The body terminal is coupled to a bias voltage source. In one embodiment, the bias voltage source is ground of 0V. Coupling the body terminal to other voltage sources may also be useful. In one embodiment, the body terminal is commonly coupled to the source terminal (or first S/D region) of the transistor.

The device region, in one embodiment, is a symmetrical device region. The device region is symmetrical viewed along a thickness direction of the gate. For example, the two halves of the device region as separated by the dotted line are mirror images of each other. This produces a symmetrical device, for example, having two source regions, two body contact regions, two gates and one drain connector. The device, for example, is a dual gate transistor. In other embodiments, more than two gates may be provided for the transistor. Other configurations of the device may also be useful. For example, a non-symmetrical device may be provided in the device region.

As described, the present device has longer drift region without increasing device area laterally, allowing the device to operate in lower gate-drain capacitance (Cdg) and $Rds_{on}$ regimes. This greatly increases the performance of the device as well as reliability due to higher BVdd. By providing the source vertically, the gate length is not dependent on lithography tolerance. Therefore, the scalability of the gate length can be increased by increasing the trench depth, eliminating the lateral constraints. Furthermore, the process of fabricating a trench LDMOS device can easily be integrated into CMOS process without incurring additional fabrication costs.

Figure 1B:
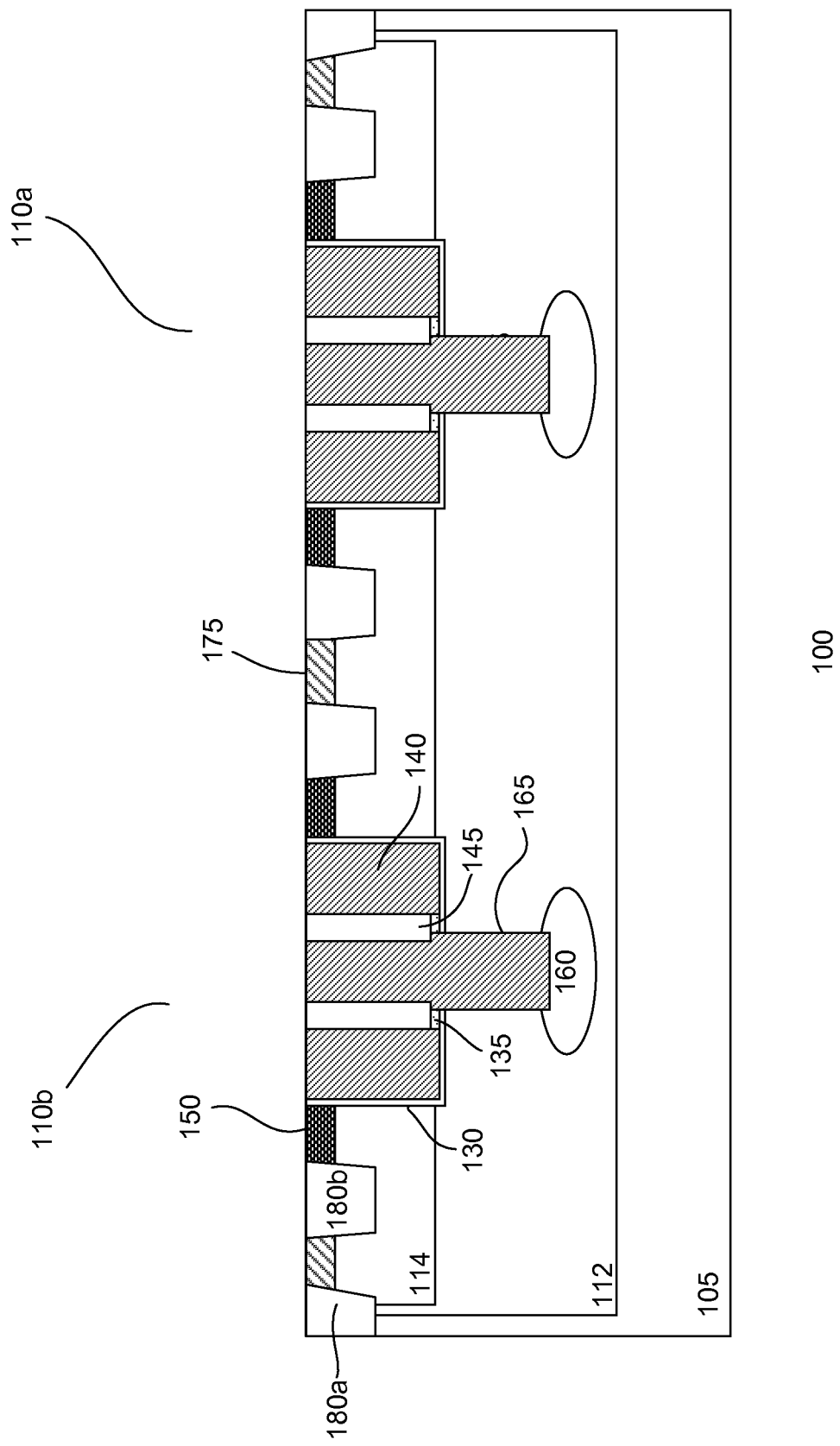
FIG. 1b shows cross-sectional view of another embodiment of a device.

FIG. 1b shows another embodiment of a device 100. The device is similar to the device shown in FIG. 1a. As such, common elements may not be described or described in detail. The device, as shown, includes first and second transistors 110a-b formed in the device reigon. The first and second transistors are coupled in parallel to form a finger configuration. Similar types of terminals of the transistors are commonly coupled to form a finger configuration. For example, the first S/D regions 150 of the transistors are commonly coupled, the second S/D regions 160 of the transistors are commonly coupled, the gates 140 of the transistors are commonly coupled and the body contacts 175 of the transistors are commonly coupled. In other embodiments, more than two transistors are coupled in a finger configuration. Coupling transistors in a finger configuration increases the drive current of the device.

Figure 2A:
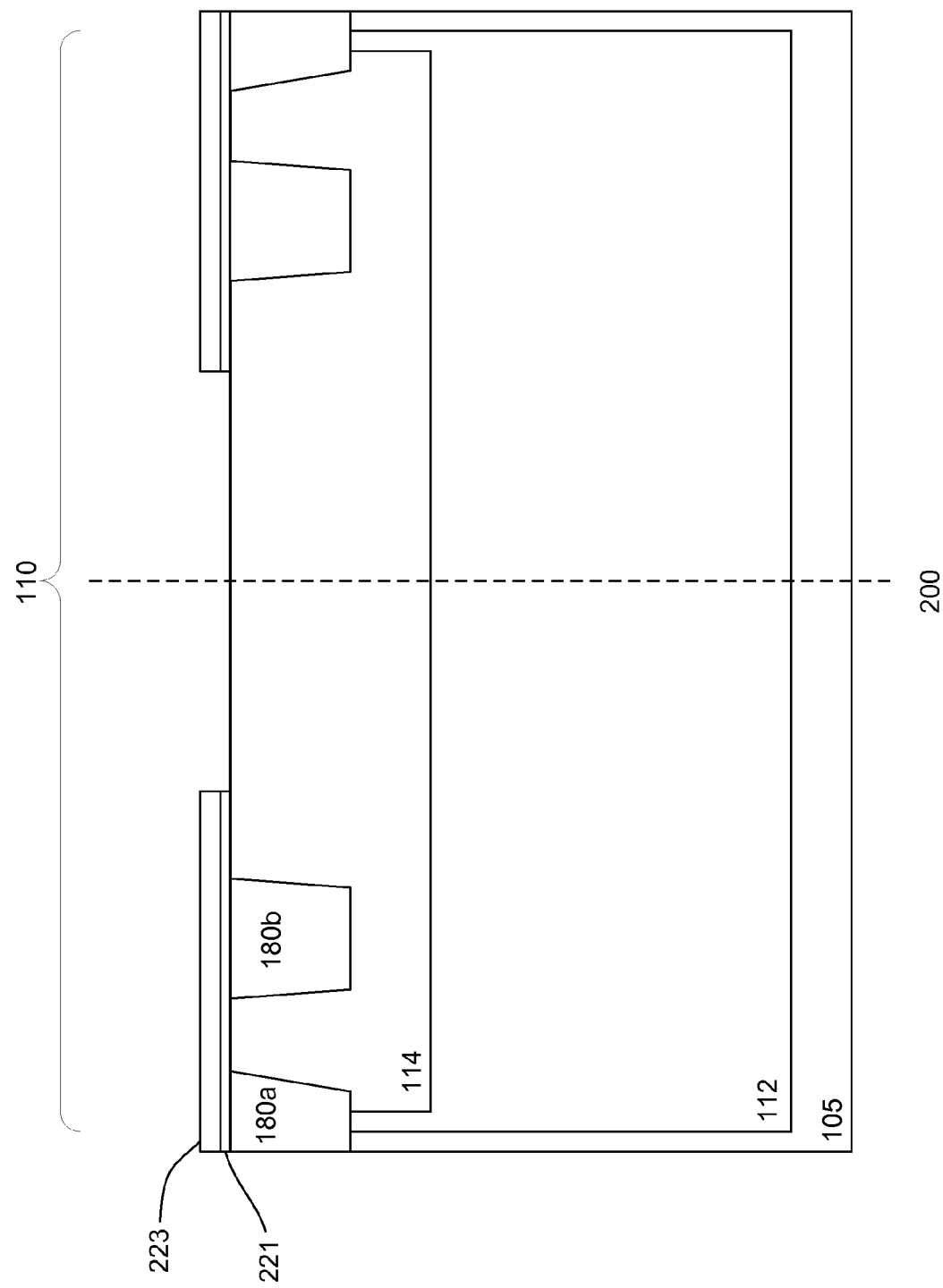

FIGS. 2a-l show cross-sectional views of an embodiment of a process 200 for forming a device or IC. Referring to FIG. 2a, a substrate 105 is provided. The substrate can be a silicon substrate, such as a lightly p-type doped substrate. Other types of substrates, including silicon germanium or silicon-on-insulator (SOI), are also useful.

As shown in FIG. 2a, a device region 110 is defined on the substrate. Although one device region is shown, it is however understood that the substrate may include various types of regions (not shown). For example, the substrate may include other device regions for other types of devices. The IC may include logic regions in which logic devices are formed. Depending on the type of IC formed, the logic regions, for example, may include regions for different voltage devices. For example, the logic regions may include regions for high voltage (HV) devices, medium or intermediate voltage (IV) devices and low voltage (LV) devices. Other configurations of logic regions may also be useful. Additionally, other types of device regions may also be provided.

The device region is separated from other regions by a device isolation region 180a. The device isolation region surrounds the device region. In one embodiment, the device region also includes an internal device isolation region 180b to separate the device region into first and second device sub-regions 110a-b. The internal device isolation region, for example, surrounds the first device sub-region. In one embodiment, the device isolation region and internal device isolation region are concentric isolation regions. For example, the second device sub-region completely surrounds the first device sub-region with them separated by the internal device isolation region. In other embodiments, the isolation regions are configured to provide a second device sub-region which partially surrounds the first device sub-region, such as on one, two or three sides. Other configurations of isolation regions may also be useful.

An internal device isolation region 180b may be provided to separate the device region into sub-regions. The internal device isolation region may be used to provide separate sub-regions for different types of doped regions, such as surface diffusion regions. The internal device isolation region, for example, may be provided on one side of the device region. The internal device isolation may be disposed in the device region along the direction of the width of the gate. Providing the internal device isolation region in a direction which is perpendicular to the width of the gate may also be useful.

In other embodiments, the device region is a symmetrical device region. The device region includes internal device isolation region or regions within the device isolation region. The internal device isolation region may be an isolation region disposed concentrically within device region. In some embodiments, two internal device isolation regions may be provided within the device isolation region. Other configurations of isolation regions may also be useful.

The isolation regions are, for example, STIs. Various processes can be employed to form the STI regions. For example, the substrate can be etched using etch and mask techniques to form trenches which are then filled with dielectric materials such as silicon oxide. Chemical mechanical polishing (CMP) can be performed to remove excess oxide and provide a planar substrate top surface. Other processes or materials can also be used to form the STIs. In other embodiments, the isolation may be other types of isolation regions. The depth of the STIs may be, for example, about 3000-4500 Å. Other depths for the STIs may also be useful.

A first device doped well 112 is formed in the device region. The first device doped well serves as a drift well for the device. The first device doped well, in one embodiment, is a deep device doped well. The depth of the first device doped well, for example, may be about 3-5 μm. Providing a first device doped well of other depths may also be useful. For example, the depth of the first device doped well should be sufficient to produce the desired drift length $L_D$ of the transistor formed in the device. The first device doped well is first polarity type dopants for a first polarity type device. For example, a n-type first device doped well is provided for a n-type device. Forming a p-type first device doped well for a p-type device may also be useful. In one embodiment, the first device doped well is a lightly doped well. Other dopant concentrations for the first device doped well may also be useful.

A second device doped well 114 is formed in the device region. The second device doped well serves as a body well for the first type transistor. The second device doped well is second polarity type dopants. In one embodiment, the second device doped well is a lightly or medium doped device well. For example, the dopant concentration of the second device doped well is about $5E12-1E13/cm^3$. Other dopant concentrations for the second device doped well may also be useful. The second device doped well, in one embodiment, is formed within the first device doped well. For example, the second device doped well has a depth which is shallower than the first device doped well. The depth, for example, is equal to the desired channel length of the transistor which is formed in the device region. In one embodiment, the depth of the second device doped well is about 0.8 μm. Other depths for the second device doped well may also be useful.

To form a device doped well, an implant mask which exposes the device region is used. The implant mask, for example, is photoresist layer patterned by a lithographic mask. Since the device isolation region can serve as an implant mask, this allows for increased processing window for the patterning process to form the implant mask. Dopants are implanted into the substrate using the implant mask. The dopants are implanted with the appropriate dose and power. In some embodiments, a device doped well may be formed by, for example, performing multiple implants at different energies.

The implant processes used to form the device doped wells may be compatible or the same as processes used to form other similar types of wells in the device. For example, the processes may be compatible with those used in current CMOS processes for forming similar types of wells. For example, the first device doped well may be formed at the same time as the deep doped well. This allows the same lithographic mask of the current CMOS implant mask to be used to pattern the implant mask for the first device mask. For example, the current CMOS implant mask may be customized to include the first device doped well opening. In other embodiments, a separate first device doped well mask may be used to specifically tailor the doping of the first device doped well. In such cases, the same mask can also be used to form the second device doped well.

An anneal is performed. In one embodiment, the anneal is performed after the first and second device doped wells are formed. The anneal diffuses the dopants from the implant, forming first and second device doped wells which extend to under the bottom of the device isolation region. In other embodiments, separate anneals may be performed for the first and second device doped wells. For example, an anneal may be performed after forming a doped well.

The isolation regions, for example, may be formed prior to forming the device doped wells. In other embodiments, the isolation regions may be formed after forming the device doped wells. Other configurations of forming the isolation regions and device doped wells may also be useful.

A hard mask layer 223 is formed on the surface of the substrate. The hard mask layer, in one embodiment, is silicon nitride. The hard mask layer, for example, may be about 1500 Å thick. A pad layer 221 may be provided beneath the hard mask. The pad layer, for example, may be silicon oxide. The pad layer may serve to improve adhesion of the hard mask to the substrate. The thickness of the pad layer may be about 200 Å. Other types of hard mask layer or combination of hard mask and pad layers may also be useful.

The hard mask and pad layers are patterned to form an opening which exposes the substrate surface. The opening corresponds to a trench in which the gate of the transistor is formed. To pattern the hard mask, a soft mask, such as photoresist may be used. The resist may be patterned using a lithographic mask to create an opening. To improve lithographic resolution, an anti-reflective coating (ARC) may be provided beneath the resist. An anisotropic etch, such as reactive ion etch (RIE), may be employed to transfer the pattern of the resist to the hard mask.

Figure 2B:
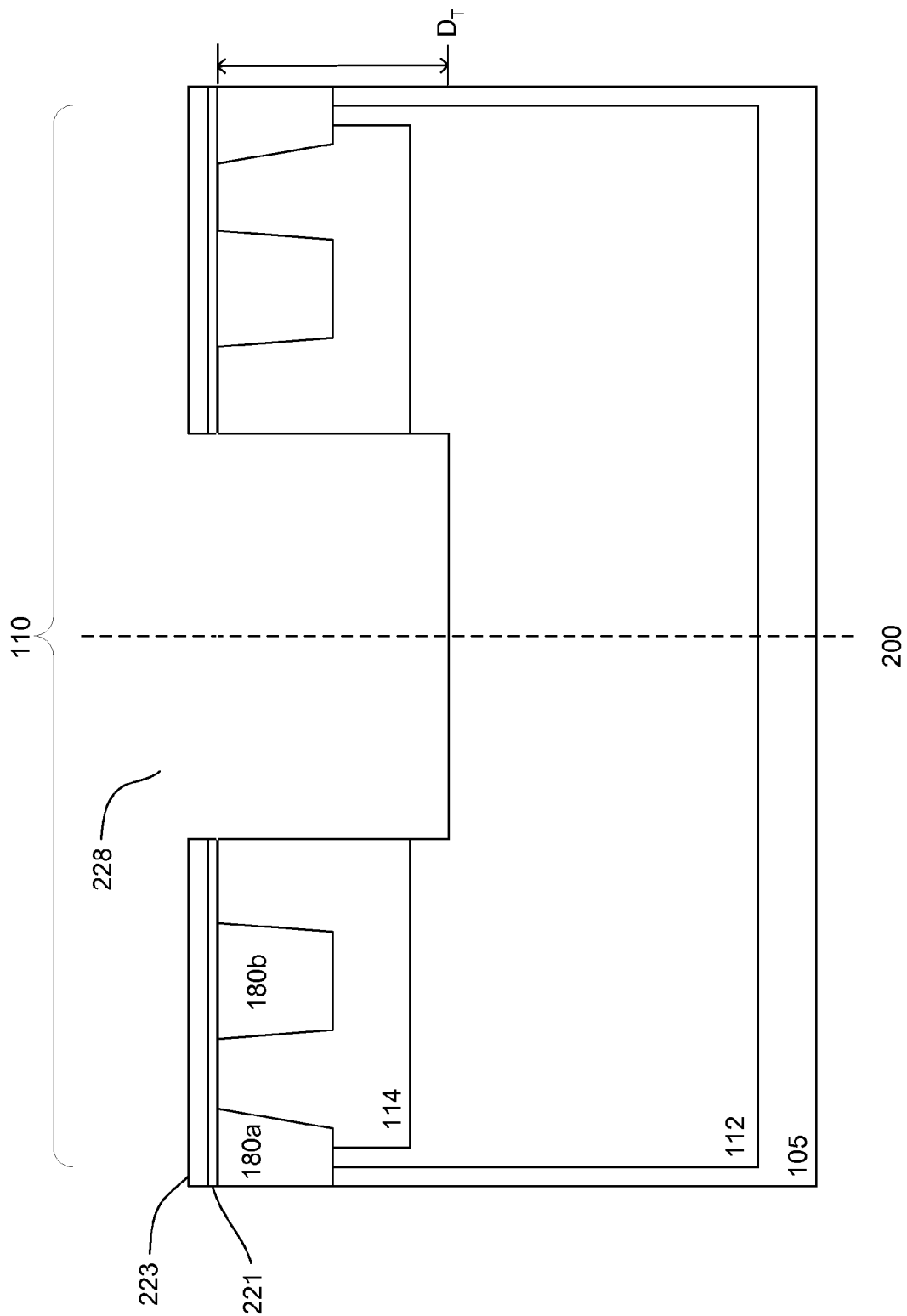

Referring to FIG. 2b, a trench 228 is formed in the substrate. In one embodiment, the trench is formed by a RIE, using the hard mask as an etch mask. The trench formed has a depth $D_T$ which is deeper than the interface of the first and second device doped wells. The depth $D_T$, for example, may be about 0.3 μm below the interface of the device doped wells. Other depths relative to the interface of the device doped wells may also be useful.

The exposed trench walls, for example, are cleaned. For example, the trench walls are cleaned to remove any surface damage from the RIE etch. In one embodiment, the cleaning of the trench walls is performed by exposure to hydrogen plasma at a temperature in the range from about 200-400° C.

for a period of from about 5 to about 60 seconds. Other techniques for cleaning the substrate may also be useful. A thermal process, for example, thermal oxidation is carried out to deposit an oxide layer on the trench walls. The oxide layer is removed, for example, by wet etch.

Figure 2C:
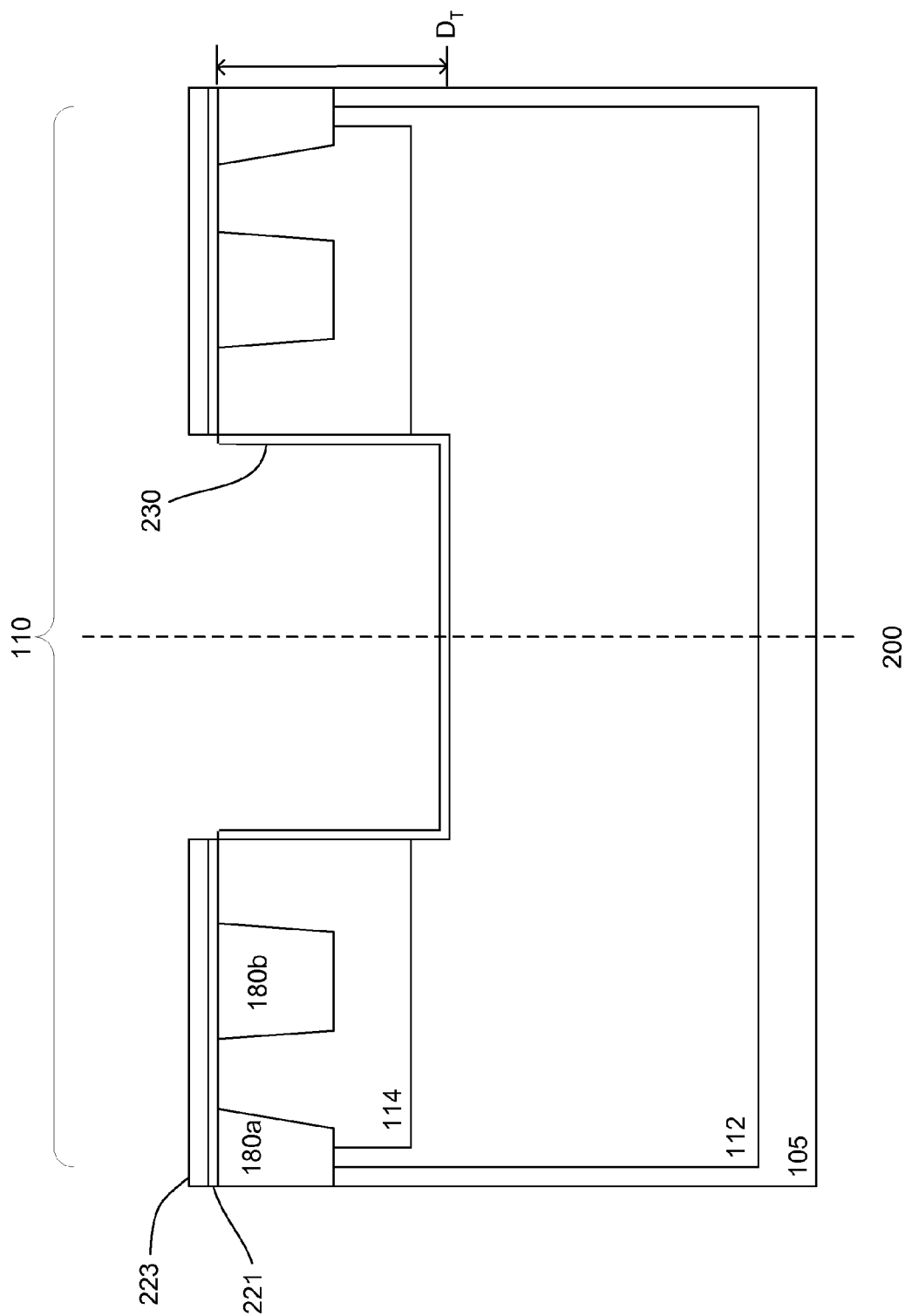

In FIG. 2c, a gate dielectric layer 230 is formed on the exposed trench walls. The gate dielectric layer, in one embodiment, is silicon oxide. Other types of gate dielectric materials, such as SiON, may also be useful. The gate dielectric layer, in one embodiment, is formed by thermal process, such as thermal oxidation. For example, the dielectric layer is formed by a wet oxidation followed by annealing the substrate in an oxidizing ambient. The temperature of the wet oxidation can be, for example, about 750-900° C. The annealing can be, for example, performed at a temperature of about 1000° C. Alternatively, the dielectric layer may be formed by a partial wet oxidation. The thermal process selectively forms the gate dielectric layer on the exposed trench walls. Other techniques for forming the gate dielectric layer may also be useful. The thickness of the gate dielectric layer may be about 100-1000 Å. Other thicknesses for the gate dielectric layer may also be useful.

Figure 2D:
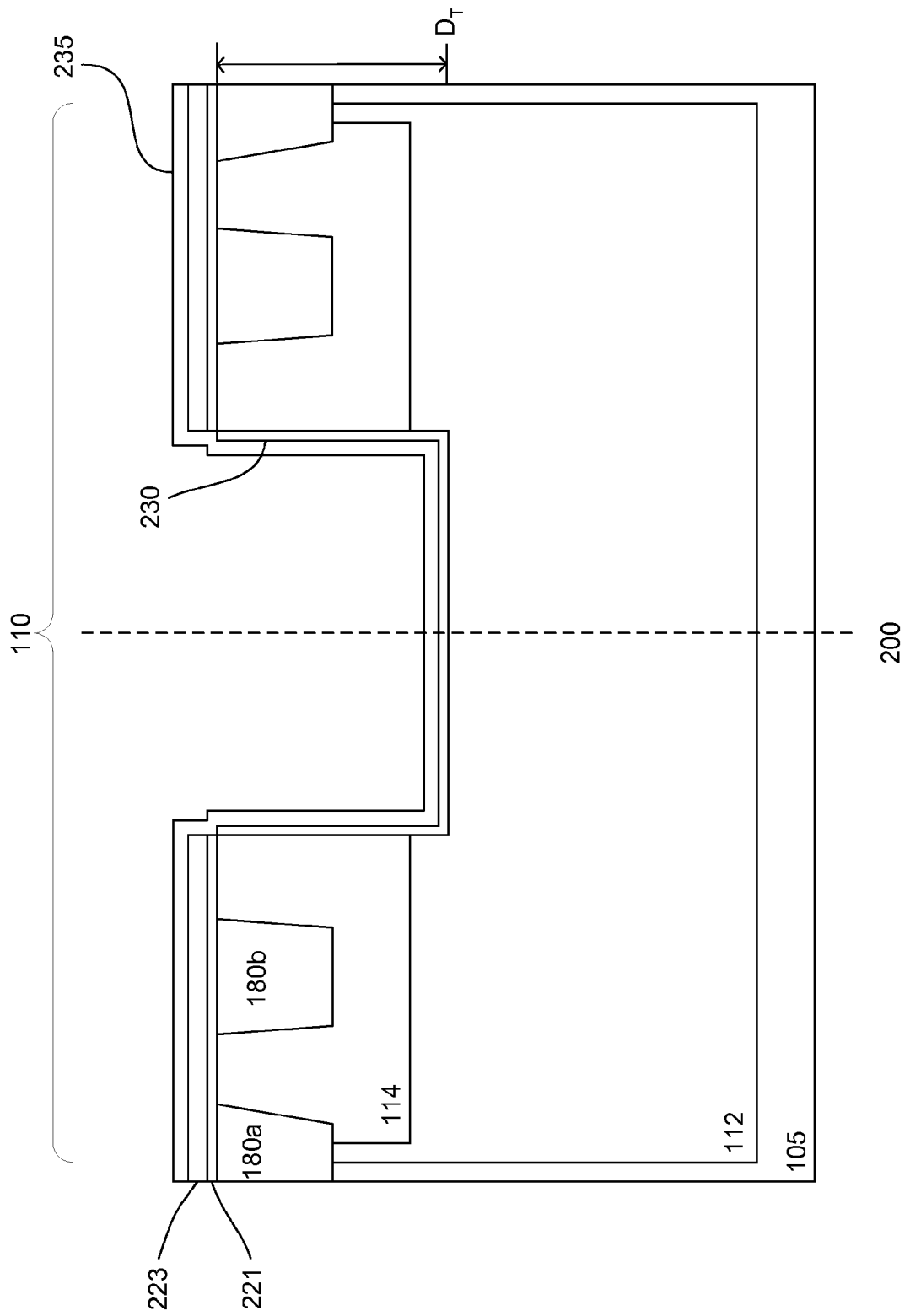

As shown in FIG. 2d, a protective layer 235 is formed on the substrate, covering the hard mask and gate dielectric layer. The protective layer serves to protect the gate dielectric layer from damage during subsequent processing to form the device. The protective layer, for example, is silicon nitride. Other types of materials which can be selectively removed with respect to the gate dielectric layer may also be useful. The thickness of the protective layer may be about 100-500 Å. Other thicknesses for the protective layer may also be useful. The protective layer, for example, may be formed by chemical vapor deposition (CVD). Other techniques for forming the protective layer may also be useful.

Figure 2E:
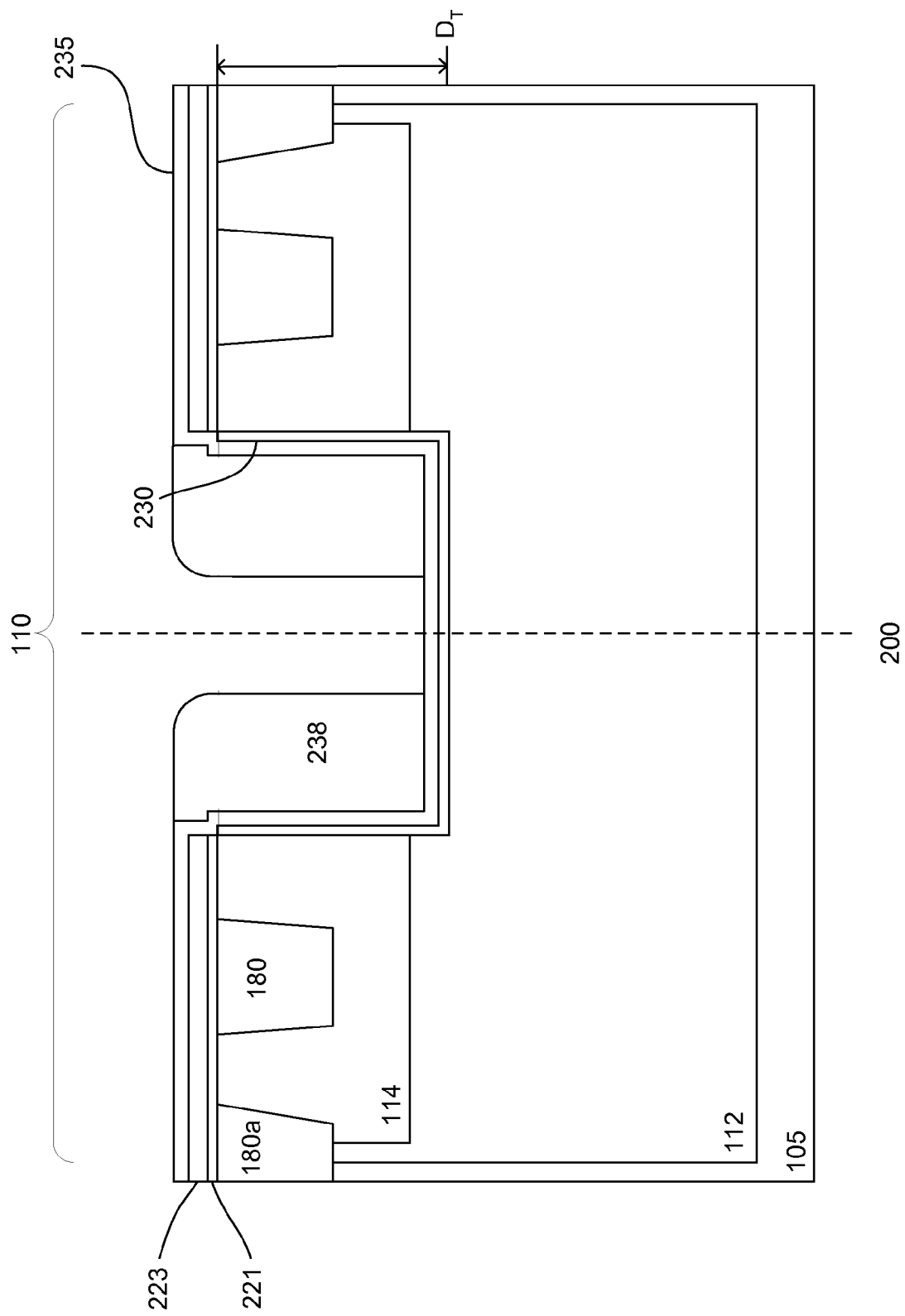

Referring to FIG. 2e, sidewall spacers 238 are formed on the trench sidewalls. The sidewall spacers, in one embodiment, are formed from a dielectric material which can be selectively removed with respect to the protective layer. In one embodiment, the dielectric material can be selectively removed with respect to the protective layer and subsequently formed drain connector material. The sidewall spacers, for example, are formed from silicon oxide. Other types of spacer materials may also be useful. For example, the spacer material may include silicon nitride.

To form the sidewall spacers, a sidewall spacer layer is formed on the substrate. The sidewall spacer layer covers the protective layer and lines over the substrate and lines the trench walls. The sidewall spacer layer, for example, is deposited by CVD. Other techniques for forming the sidewall spacer layer may also be useful. In one embodiment, a TEOS layer is deposited on the substrate by CVD. The thickness of the sidewall spacer layer should equal to the thickness of the gate electrode and gate insulator layer. In one embodiment, the thickness of the sidewall spacer layer may be about 3000 Å. Other sidewall spacer layer thicknesses may also be useful. An anisotropic etch, such as an RIE, is performed to remove horizontal portions of the sidewall spacer layer, forming sidewall spacers on the trench sidewalls.

Figure 2F:
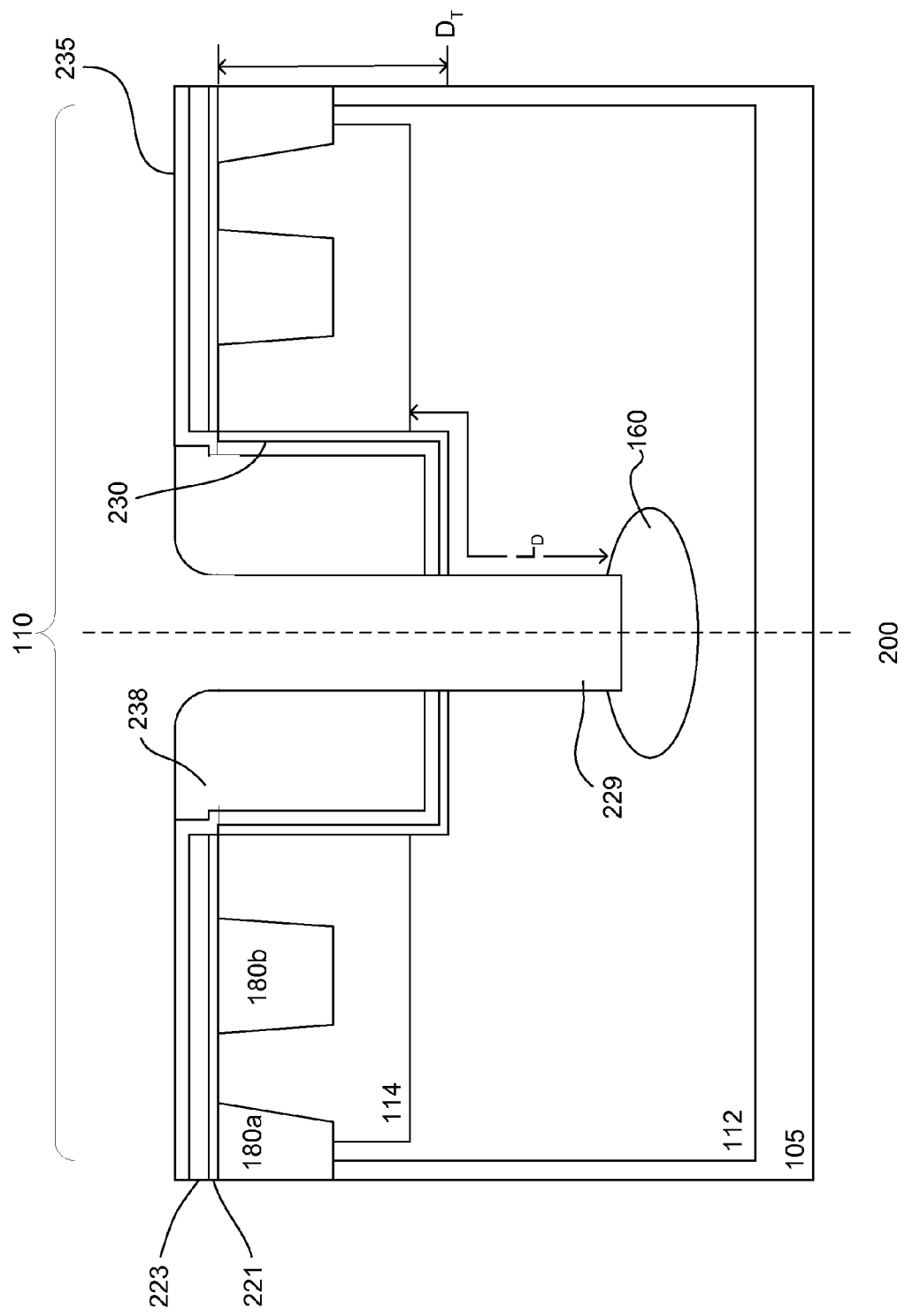

The substrate is etched by an RIE using the sidewall spacers and hard mask as an etch mask. The etch forms a drain connector trench 229 in which the drain connector is formed, as shown in FIG. 2f. For example, the etch removes exposed protective layer, gate dielectric and substrate to form the drain connector trench. The depth of the drain connector trench should produce the desired drift length $L_D$ between the bottom of the trench and channel. The depth of the drain connector trench, for example, is about 0.5-5 μm from the surface of the substrate. Other depths for the drain connector trench may also be useful.

Dopants are implanted into the substrate. In one embodiment, first polarity type dopants are implanted into the substrate. The implant forms the doped region at the bottom of the trench, using the sidewall spacers and hard mask as an implant mask. An anneal is performed to diffuse and activate the dopants to form a buried doped region 160. The buried doped region serves as a buried drain region of the device. In one embodiment, a buried doped region heavily doped with first polarity type dopants is formed. For example, the buried doped region has a dopant concentration of about $5E15/cm^3$. Forming a buried doped region with other dopant concentrations may also be useful. The implantation energy can be carried out at energy in the range of, for example, approximately 30-60 KeV. The implant dose can be, for example, in the range of about $E15/cm^2$. Other implant energies and/or doses may be used to form the buried doped region.

Figure 2G:
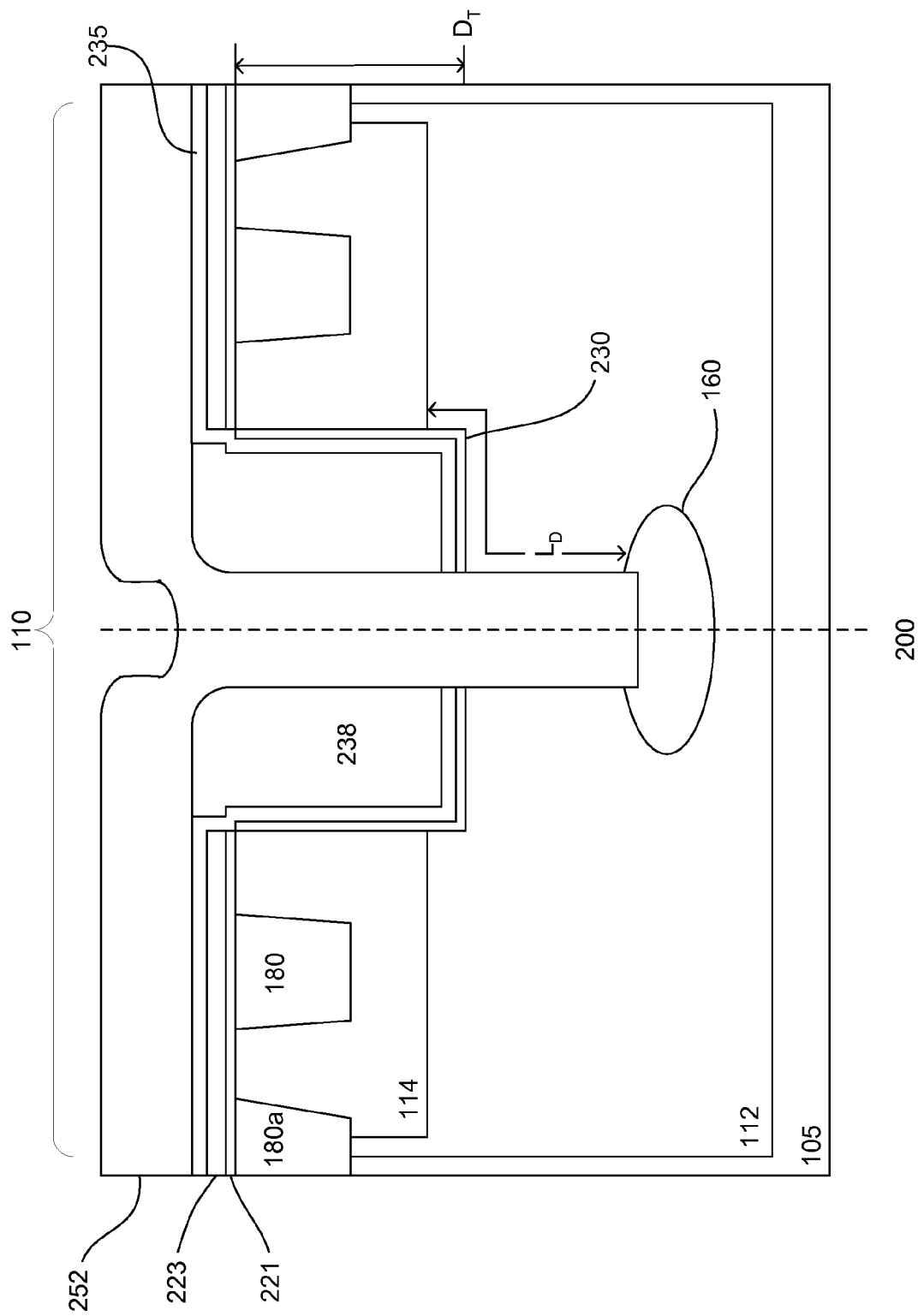

Referring to FIG. 2g, a drain connector layer 252 is deposited on the substrate. The drain connector layer fills the drain connector trench and covers substrate surface. In one embodiment, the drain connector layer is polysilicon. The drain connector layer can be formed as an amorphous or non-amorphous layer. In one embodiment, the polysilicon layer is heavily doped with first polarity type dopants to provide electrical coupling to the buried doped region. Various techniques may be employed to dope the drain connector layer, for example, insitu doping or ion implantation. In one embodiment, the drain connector layer is an insitu doped layer. To form the drain connector layer, techniques such as CVD can be used. Other techniques may also be useful. In one embodiment, the drain connector layer and the gate electrode are preferably the same material.

In some embodiments, the drain connector layer and the gate electrode need not be the same material. Other types of materials may also be used to form the drain connector layer. For example, the drain connector layer may include conductive materials, such as tungsten.

Figure 2H:
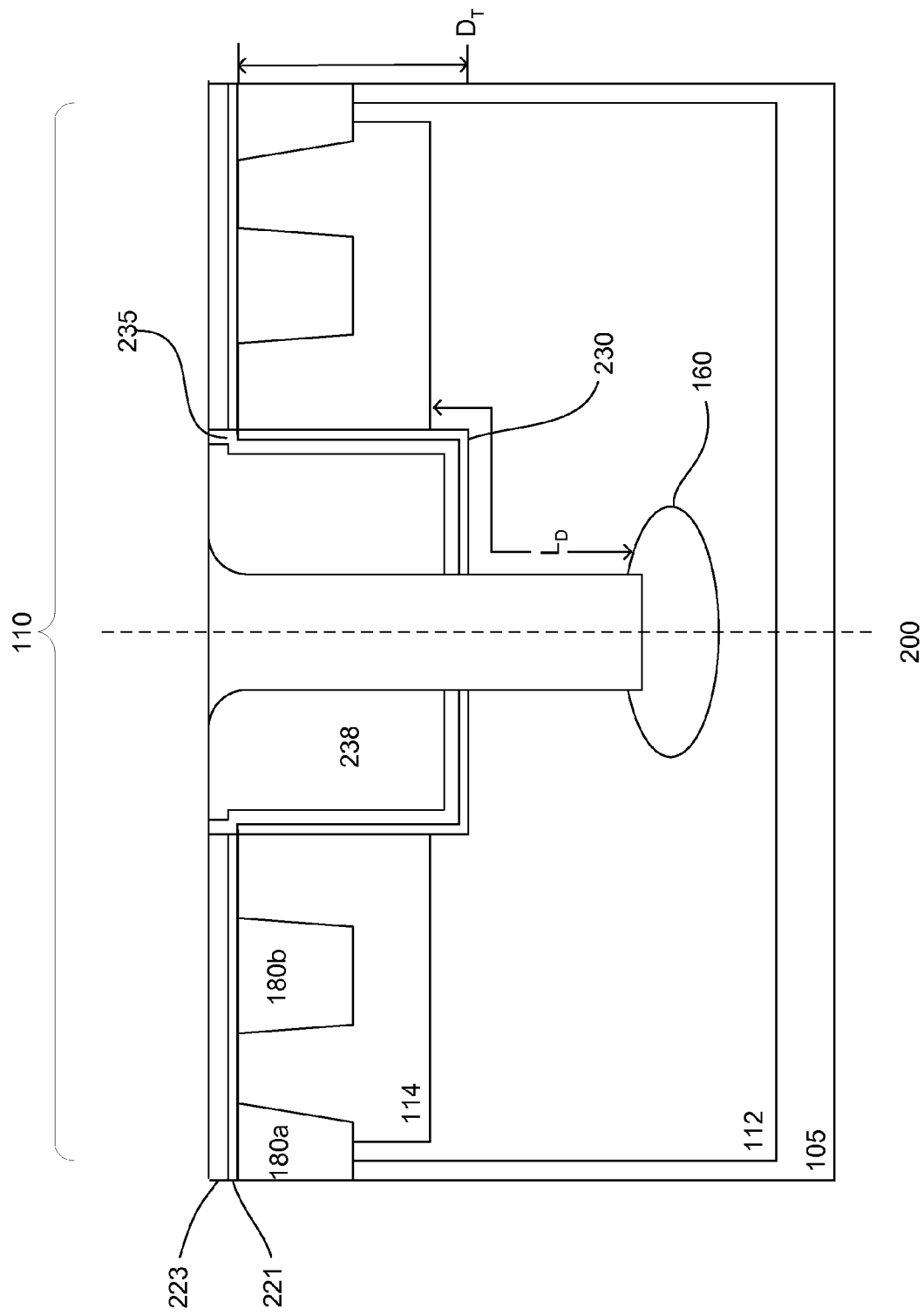

In FIG. 2h, a planarization process is performed to remove excess material of the drain connector layer. In one embodiment, a polishing process, such as CMP, is performed to remove the excess drain connector material over the substrate surface. Other types of planarization processes may also be useful to remove the excess drain connector material. The planarization process, in one embodiment, produces a planar top surface between the drain connector layer and hard mask. Alternatively, an over-polish to the drain connector layer may be employed to ensure that the excess drain connector material is removed. The over-polish, for example, recesses the drain connector material in the trench below the top surface of the hard mask.

Figure 2I:
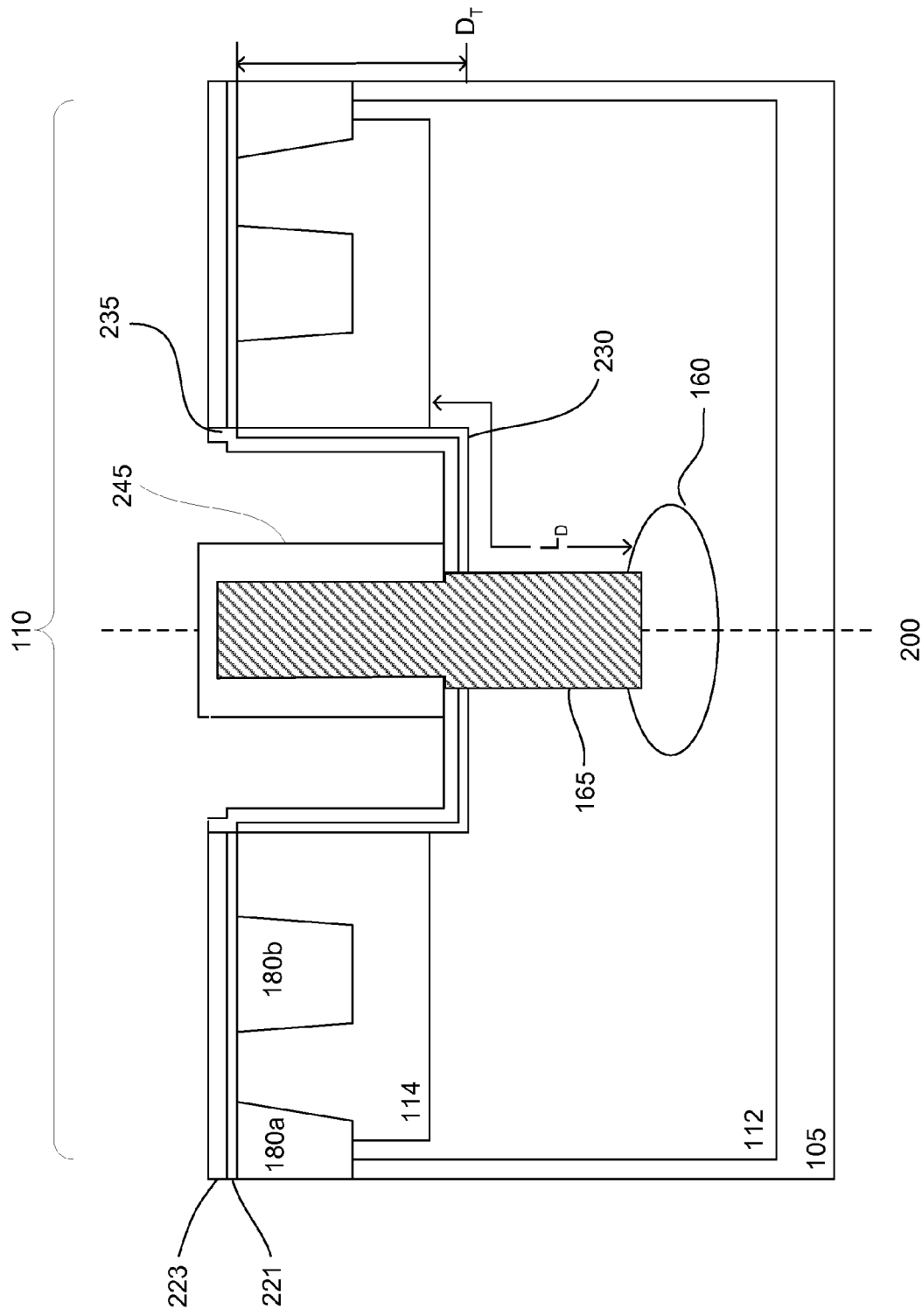

Referring to FIG. 2i, the sidewall spacers are removed. In one embodiment, the sidewall spacers are removed by an isotropic etch, such as a wet etch. The etch removes the sidewall spacers selective to the drain connector 165 and the protection layer. For example, the etch employs a chemistry which removes the sidewall spacers, leaving the drain connector and protection layer remaining Removing the sidewall spacers leaves a gap between the trench sidewalls and exposed portion of the drain connector. The gap serves as a gate trench in which a gate is formed.

A gate insulator layer 245 is formed on the exposed portion of the drain connector. In one embodiment, the gate insulator layer is selectively formed on the exposed portion of the drain connector. A thermal process is employed to selectively form the gate insulator layer on the exposed portion of the drain connector. In one embodiment, a thermal oxidation process is employed to form a silicon oxide gate insulator layer. For example, the silicon oxide gate insulator layer is formed by a wet oxidation. Alternatively, the silicon oxide gate insulator layer may be formed by a dry oxidation. Forming other types of gate insulator layers may also be useful. The thickness of the gate insulator layer may be about 1000-4000 Å. Other thicknesses for the gate insulator layer may also be useful.

Figure 2J:
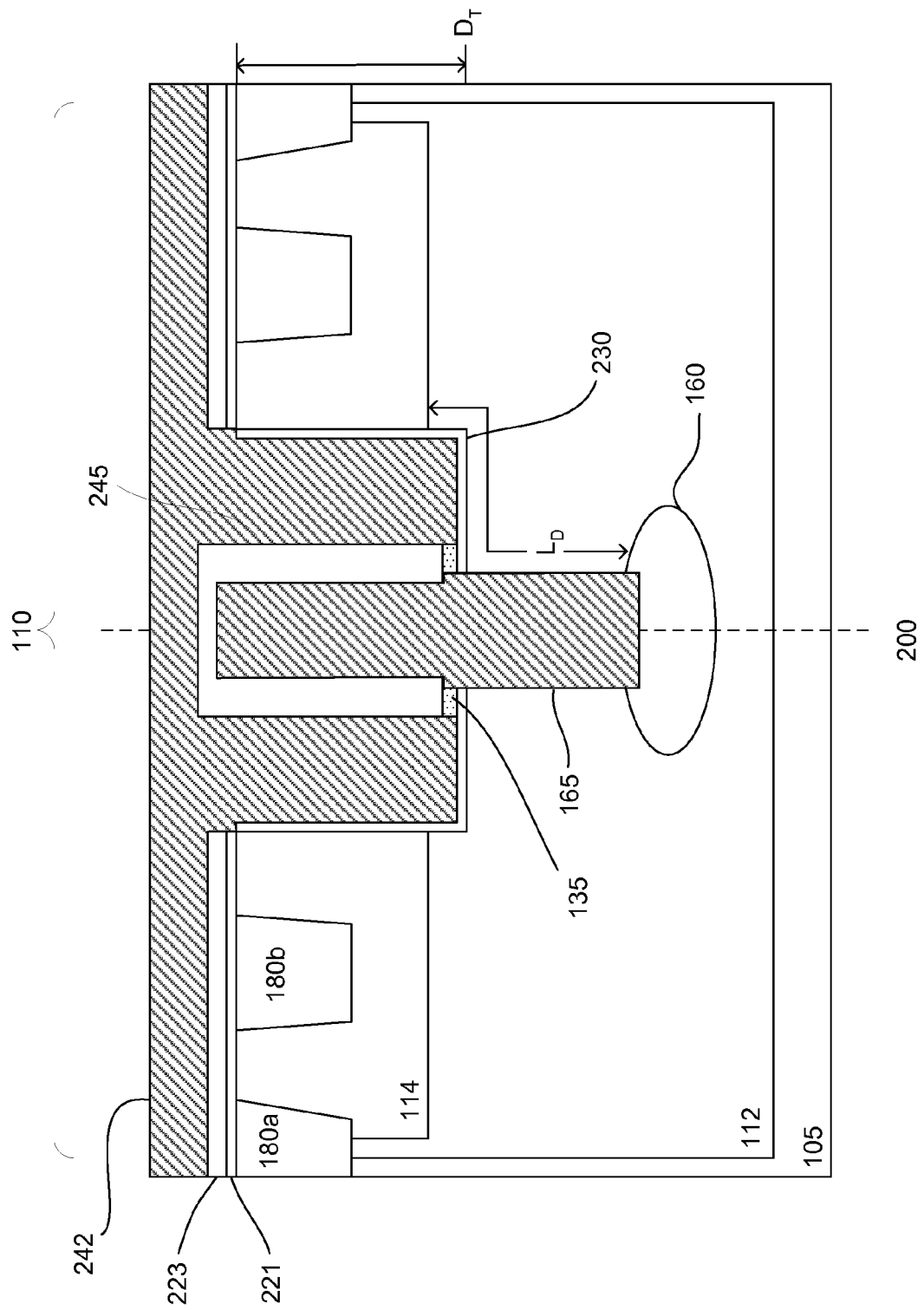

Referring to FIG. 2j, the protection layer is removed to expose the gate dielectric. In one embodiment, the protection layer is removed using a wet etch. The wet etch selectively removes the protection layer, leaving the gate dielectric remaining A portion of the protective layer remains to form secondary gate insulator 135.

A gate electrode layer 242 is formed on the substrate. The gate electrode layer fills the gate trenches and covers the substrate. The gate electrode layer is, in one embodiment, polysilicon. The gate electrode layer can be formed as an amorphous or non-amorphous layer. The gate electrode layer may be doped. Various techniques may be employed to dope the gate electrode layer, for example, insitu doping or ion implantation. Other types of gate electrode materials may also be useful. For example, the gate electrode may be tungsten silicide (WSix). The gate electrode layer may be formed by CVD. Other techniques may also be useful.

Figure 2K:
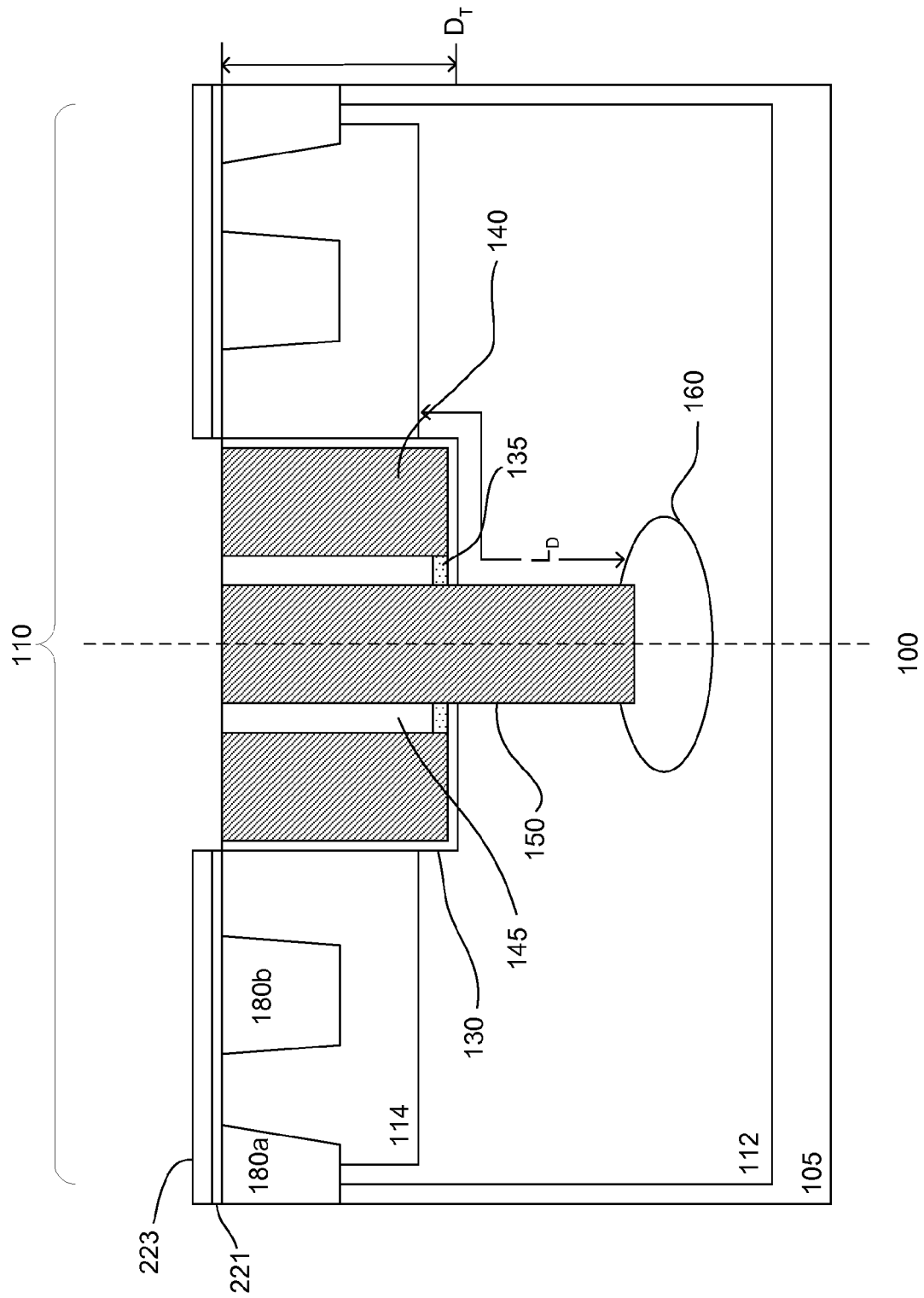
Figure 2I:
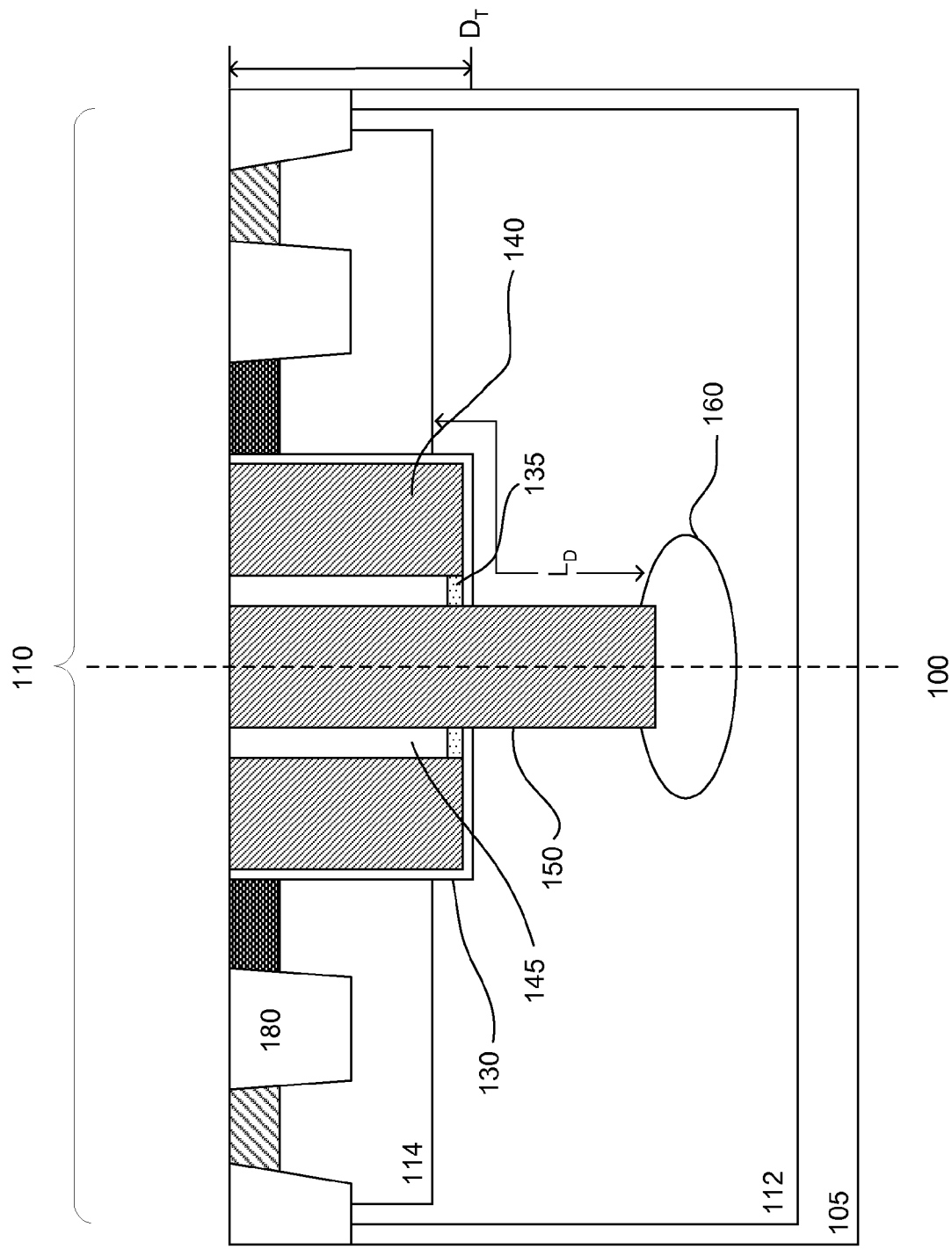

Excess gate electrode material over the substrate is removed, as shown in FIG. 2k. A planarization process is used to remove excess material of the drain connector layer. In one embodiment, a polishing process, such as CMP, is used to remove the excess gate electrode material over the substrate surface. Other types of planarization processes may also be useful to remove the excess gate electrode material. The hard mask, for example, serves as a polish stop for the planarization process. In one embodiment, an over-polish may be employed to ensure that the gate insulator material on top of the drain connector is removed, to form primary gate insulators 145. The over-polish, for example, recesses the materials (gates and drain connector) in the trench below the top surface of the hard mask. The over-polish also may result in the materials in the trench being planar with the top surface of the substrate.

As shown, gates 140 are formed on either sides of the drain connector, along the width direction of the channel. In other embodiment, the gates surround the drain connector. The hard mask is removed. In one embodiment, the hard mask is removed using a wet etch. The pad oxide is removed, for example, using wet etch. A screen oxide layer may be formed on the surface of the substrate. The screen oxide layer serves as an implant mask for forming the first S/D regions and body contact regions. In another embodiment, the pad oxide serves as an implant mask for forming the first S/D regions and body contact regions. First S/D regions and body contact regions are formed. The first S/D regions are heavily doped with first polarity type dopants while the body contact regions are heavily doped with second polarity type dopants. The first S/D regions and body contact regions are formed using separate implant processes with separate implant masks.

The disclosure may be embodied in other specific forms without departing from the spirit or essential characteristics thereof. The foregoing embodiments, therefore, are to be considered in all respects illustrative rather than limiting the disclosure described herein. Scope of the disclosure is thus indicated by the appended claims, rather than by the foregoing description, and all changes that come within the meaning and range of equivalency of the claims are intended to be embraced therein.

What is claimed is:

1. A method of forming a device comprising:
 providing a substrate defined with a device region;
 forming a buried doped region in the substrate in the device region;
 forming a trench having upper and lower portions of different widths in the substrate in the device region;
 forming sidewall spacers on sidewalls of the upper portion of the trench, leaving a portion of the upper portion unfilled;
 forming a drain connector in the trench;
 removing the sidewall spacers, the removal of the sidewall spacer leaves a gap between the sidewalls of the trench and exposes a portion of the drain connector;
 forming a gate in the upper portion of the trench in the substrate in the device region, wherein a channel of the device is disposed on a sidewall of the upper portion of the trench, the buried doped region is disposed below the gate, wherein a distance from the buried doped region to the channel is a drift length $L_D$ of the device, wherein forming the gate comprises
  forming gate insulator layer on the exposed portion of the drain connector, and
  forming gate electrodes on either side of the gate insulators in the upper portion of the trench; and
 forming a surface doped region adjacent to the gate.

2. The method of claim 1 wherein the device region is surrounded by device isolation region.

3. The method of claim 2 wherein the device region comprises one or more internal device region, dividing the device region into multiple device sub-regions.

4. The method of claim 3 wherein the device region comprises:
 a first device doped well;
 a second device doped well, the second device doped well has a depth equals to a channel length $L_C$ of the channel; and
 wherein the first device doped well has a depth greater than the second device doped well.

5. The method of claim 4 wherein the first device doped well comprises first polarity type dopants and the second device doped well comprises second polarity type dopants.

6. The method of claim 5 wherein the second device doped well is disposed substantially within the first device doped well.

7. The method of claim 6 wherein forming a gate in the trench comprises
 forming the trench in the first and second device doped wells.

8. The method of claim 7 wherein forming the trench comprises:
 forming the upper portion of the trench, the upper portion has a depth greater than an interface of the first and second device doped wells, wherein exposed sidewalls of the upper portion is lined with a gate dielectric layer;
 lining a protective layer on the gate dielectric layer;
 forming sidewall spacers on sidewalls of the upper portion of the trench, leaving a portion of the upper portion unfilled; and
 etching the substrate in the first device doped well to form the lower portion of the trench, the sidewall spacers serve as an etching mask.

9. The method of claim 8 wherein forming the drain connector comprises filling the trench with a drain connector layer.

10. The method of claim 9 wherein forming the gate electrodes comprises:
removing the protective layer except the portion which is protected by the gate insulators, the remaining protective layer forms secondary gate insulators;
filling the gap between the sidewalls of the trench with a gate electrode layer;
planarizing the gate electrode layer, wherein a top surface of the gate electrode layer is substantially co-planar with a top surface of the substrate.

11. A method of forming a device comprising:
providing a substrate defined with a device region;
providing first and second device doped wells in the device region, wherein the first device doped well has a depth greater than the second device doped well;
forming a buried doped region in the first device doped well;
forming a trench having upper and lower portions of different widths in the substrate in the device region;
forming sidewall spacers on sidewalls of the upper portion of the trench, leaving a portion of the upper portion unfilled;
forming a drain connector in the trench;
removing the sidewall spacers, the removal of the sidewall spacer leaves a gap between the sidewalls of the trench and exposes a portion of the drain connector;
forming a gate in the upper portion of the trench in the substrate in the device region, wherein a channel of the device is disposed on a sidewall of the upper portion of the trench, the buried doped region is disposed below the gate, wherein a distance from the buried doped region to the channel is a drift length $L_D$ of the device, wherein forming the gate comprises
forming gate insulator layer on the exposed portion of the drain connector, and
forming gate electrodes on either side of the gate insulators in the upper portion of the trench; and
forming a surface doped region adjacent to the gate.

12. The method of claim 11 wherein the second device doped well has a depth equals to a channel length $L_C$ of the channel.

13. The method of claim 12 wherein the second device doped well is disposed substantially within the first device doped well.

14. The method of claim 13 wherein forming a gate in the trench comprises
forming the trench in the first and second device doped wells.

15. The method of claim 14 wherein forming the trench comprises:
forming the upper portion of the trench, the upper portion has a depth greater than an interface of the first and second device doped wells, wherein an exposed sidewall of the upper portion is lined with a gate dielectric layer;
lining a protective layer on the gate dielectric layer;
forming sidewall spacers on sidewalls of the upper portion of the trench, leaving a portion of the upper portion unfilled; and
etching the substrate in the first device doped well to form the lower portion of the trench, the sidewall spacers serve as an etching mask.

16. The method of claim 15 wherein forming the drain connector comprises filling the trench with a drain connector layer.

17. The method of claim 16 wherein forming the gate electrodes comprises:
removing the protective layer except the portion which is protected by the gate insulators, the remaining protective layer forms secondary gate insulators;
filling the gap between the sidewalls of the trench with a gate electrode layer;
planarizing the gate electrode layer, wherein a top surface of the gate electrode layer is substantially co-planar with a top surface of the substrate.

18. A method of forming a device comprising:
providing a substrate defined with a device region;
forming a buried doped region in the substrate in the device region;
forming a first trench in the substrate in the device region;
forming a second trench in the first trench, wherein the second trench has a depth deeper than the first trench;
forming sidewall spacers on sidewalls of the first trench, leaving a portion of the first trench unfilled;
forming a drain connector in the first and second trenches;
removing the sidewall spacers, the removal of the sidewall spacer leaves a gap between the sidewalls of the first trench and exposes a portion of the drain connector in the first trench;
forming a gate in the first trench in the substrate in the device region, wherein a channel of the device is disposed on a sidewall of the first trench, the buried doped region is disposed below the gate, wherein a distance from the buried doped region to the channel is a drift length $L_D$ of the device, wherein forming the gate comprises
forming gate insulator layer on the exposed portion of the drain connector, and
forming gate electrodes on either side of the gate insulators in the first trench; and
forming a surface doped region adjacent to the gate.

* * * * *